(12) United States Patent
Hiroshima et al.

(10) Patent No.: US 9,763,331 B2
(45) Date of Patent: Sep. 12, 2017

(54) PRINTED CIRCUIT BOARD, ELECTRONIC DEVICE, AND MANUFACTURING METHOD

(71) Applicant: FUJITSU LIMITED, Kawasaki-shi, Kanagawa (JP)

(72) Inventors: Yoshiyuki Hiroshima, Nakano (JP); Naoki Nakamura, Hachioji (JP); Akiko Matsui, Meguro (JP); Mitsuhiko Sugane, Ichikawa (JP); Takahide Mukoyama, Kamakura (JP); Tetsuro Yamada, Kawasaki (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/066,244

(22) Filed: Mar. 10, 2016

(65) Prior Publication Data
US 2016/0309593 A1 Oct. 20, 2016

(30) Foreign Application Priority Data

Apr. 20, 2015 (JP) ................................. 2015-085722

(51) Int. Cl.
| | |
|---|---|
| *H05K 1/14* | (2006.01) |
| *H05K 1/18* | (2006.01) |
| *H05K 3/30* | (2006.01) |
| *H05K 3/46* | (2006.01) |

(52) U.S. Cl.
CPC ............. *H05K 1/185* (2013.01); *H05K 3/306* (2013.01); *H05K 3/4644* (2013.01); *H05K 2201/10015* (2013.01)

(58) Field of Classification Search
CPC ...... H05K 1/185; H05K 3/306; H05K 3/4644; H05K 2201/10015
USPC .................................................. 174/262–266
See application file for complete search history.

(56) References Cited

U.S. PATENT DOCUMENTS

| | | | | |
|---|---|---|---|---|
| 2008/0236881 | A1* | 10/2008 | Tanaka ................. | H05K 1/0219 174/266 |
| 2010/0124035 | A1* | 5/2010 | Bandholz ............... | H05K 1/162 361/782 |
| 2015/0163909 | A1* | 6/2015 | Li ........................ | H05K 1/0216 174/266 |

FOREIGN PATENT DOCUMENTS

| | | |
|---|---|---|
| JP | 2000-188448 | 7/2000 |
| JP | 2008-28188 | 2/2008 |

\* cited by examiner

*Primary Examiner* — Hoa C Nguyen
(74) *Attorney, Agent, or Firm* — Staas & Halsey LLP

(57) ABSTRACT

A printed circuit board includes: a first electrode made of a tubular electric conductor formed on an inner wall of a first hole formed in the printed circuit board; a dielectric body disposed inside the first electrode; and a second electrode made of a tubular electric conductor formed on an inner wall of a second hole extending through the dielectric body, the second electrode having a center axis concentric with the first electrode.

9 Claims, 11 Drawing Sheets

PRINTED CIRCUIT BOARD, ELECTRONIC DEVICE, AND MANUFACTURING METHOD

CROSS-REFERENCE TO RELATED APPLICATIONS

This application is based upon and claims the benefit of priority of the prior Japanese Patent Application No. 2015-085722, filed on Apr. 20, 2015, the entire contents of which are incorporated herein by reference.

FIELD

The embodiments discussed herein are related to a printed circuit board having a capacitor, an electronic device, and a manufacturing method.

BACKGROUND

A printed circuit board mounted with electronic components is installed within an electronic device. In addition, the printed circuit board may be mounted with, for example, a capacitor in order to cut off a noise in a signal. As for the capacitor, for example, a compact and chip-type capacitor that uses a ceramic dielectric body is available.

Electronic devices have been continuously miniaturized. Accordingly, a capacitor mounted on a printed circuit board is also required to be miniaturized. However, when a component to be mounted on a printed circuit board is miniaturized, the accuracy of a mounter used in an assembly factory shall be improved. Accordingly, in recent years, there has been proposed, for example, a printed circuit board in which a capacitor is embedded.

In a printed circuit board provided with a capacitor in which an outer electrode is formed in a tubular shape on an inner circumferential surface of a hole formed in the board, a material serving as a dielectric body is filled inside the outer electrode, and a rod-shaped inner electrode is formed so as to penetrate the dielectric body, for example, a terminal of an electronic component mounted on the printed circuit board is mounted to an end portion of the inner electrode. However, in the case where an input/output route of a signal leading to the capacitor installed in the printed circuit board extends from the outermost layer of the printed circuit board such as, for example, a land installed in the end portion of the inner electrode, a noise is likely to be added to the signal. Furthermore, in the case where a capacitor is formed in a printed circuit board having a plurality of wiring layers, the capacitor may not be connected to a wiring line of a desired wiring layer when an input/output route of a signal leading to the capacitor is limited to the outermost layer of the printed circuit board.

The following are reference documents.
[Document 1] Japanese Laid-Open Patent Publication No. 2008-028188 and
[Document 2] Japanese Laid-Open Patent Publication No. 2000-188448.

SUMMARY

According to an aspect of the invention, a printed circuit board includes: a first electrode made of a tubular electric conductor formed on an inner wall of a first hole formed in the printed circuit board; a dielectric body disposed inside the first electrode; and a second electrode made of a tubular electric conductor formed on an inner wall of a second hole extending through the dielectric body, the second electrode having a center axis concentric with the first electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of the present disclosure will be described. The embodiments described below are merely examples, and the technical scope of the present disclosure is not limited to the aspects described below.

First Embodiment

Figure 1:
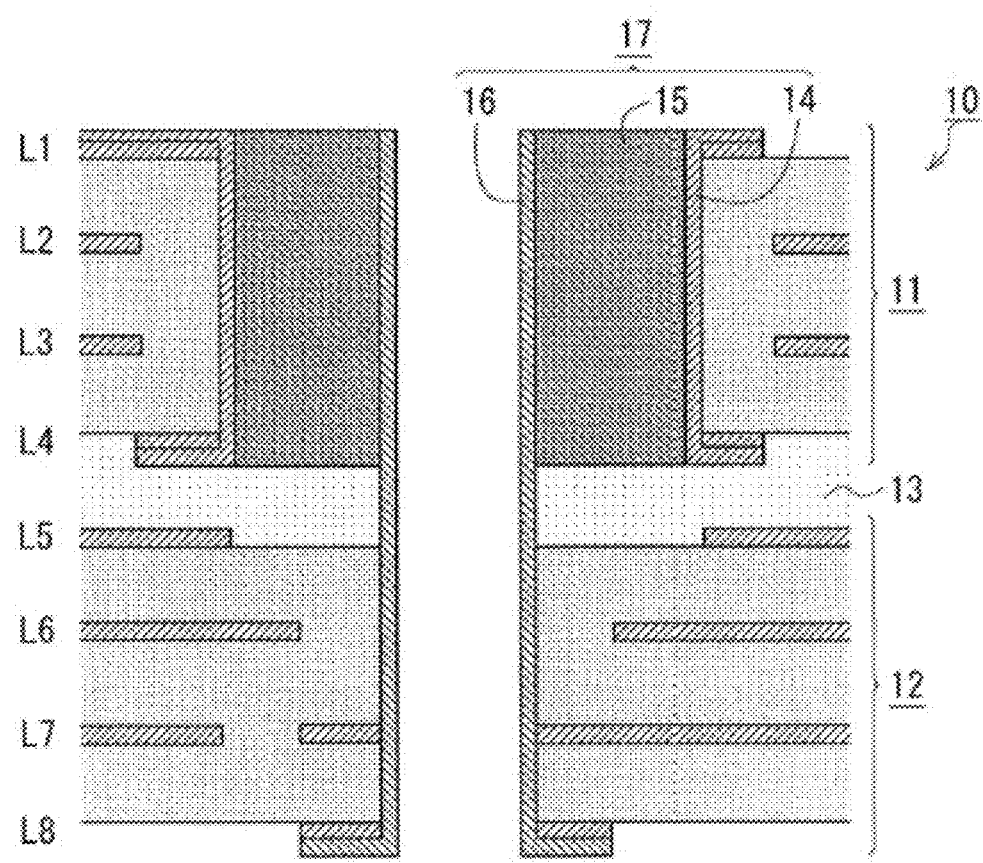
FIG. 1 is a view illustrating a portion of an internal structure of a printed circuit board according a first embodiment, in which a capacitor portion is mainly illustrated.
Figure 2:
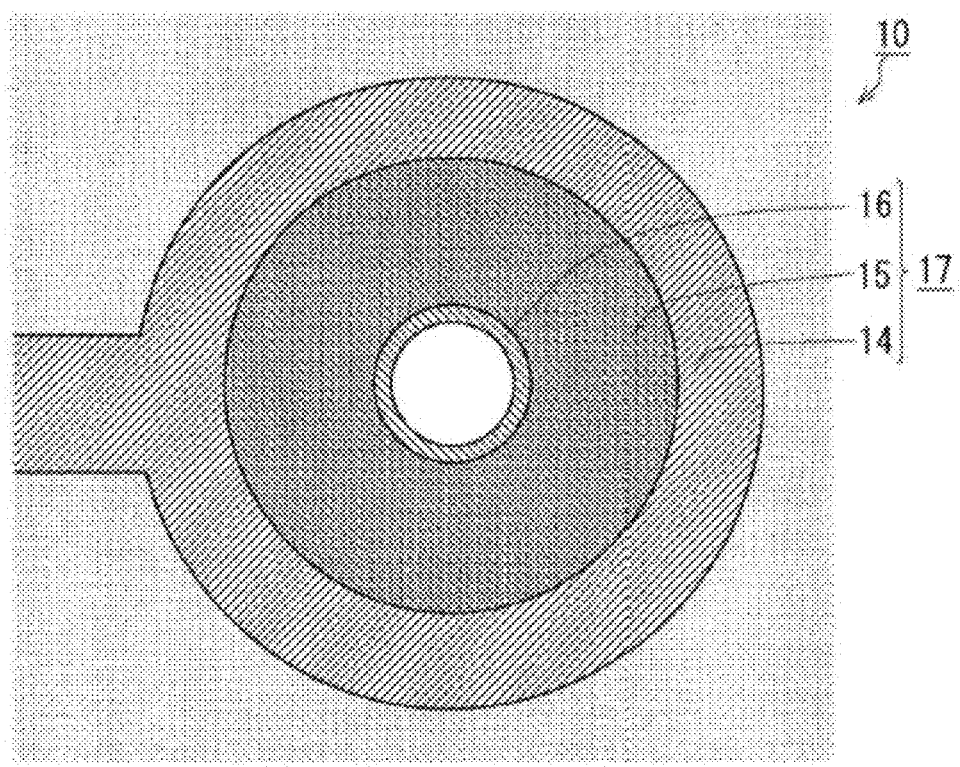
FIG. 2 is a top view of the printed circuit board according to the first embodiment, in which a capacitor portion is mainly illustrated.

FIG. 1 is a view illustrating a portion of an internal structure of a printed circuit board according a first embodiment, in which a capacitor portion is mainly illustrated. Furthermore, FIG. 2 is a top view of the printed circuit board according to the first embodiment, in which a capacitor portion is mainly illustrated.

As illustrated in FIG. 1, a printed circuit board 10 according to a first embodiment is a multilayer wiring board having eight (8) wiring layers L1 to L8 and is a board to be installed within various kinds of electronic devices. The printed circuit board 10 is a board formed by bonding a first board 11 and a second board 12 to each other by a resin, in which the first board 11 is a multilayer wiring board forming four (4) wiring layers L1 to L4, and the second board 12 is a multilayer wiring board forming four (4) wiring layers L5 to L8. Thus, in the printed circuit board 10, a resin layer 13 is provided between the wiring layer L4 and the wiring layer L5. Examples of electronic devices, within which the printed circuit board 10 is installed, may include various electronics products such as, for example, a server system or network system device, a note-type personal computer, a smartphone, a household electric product, a medical device, a game machine, an in-vehicle device, and an aviation instrument.

The printed circuit board 10 includes an outer electrode 14 (one example of a "first electrode" referred to herein). The outer electrode 14 is a tubular electric conductor formed along an inner circumferential surface of a hole extending through the first board 11. The second board 12 is bonded to the first board 11. A lower end of the outer electrode 14 is covered with the second board 12. Therefore, the outer electrode 14 takes a form similar to a so-called IVH (Interstitial Via Hole).

Furthermore, the printed circuit board 10 includes a dielectric body 15 disposed inside the outer electrode 14. The dielectric body 15 is formed so as to fill the inside of the outer electrode 14. The dielectric body 15 is formed of a non-conductive material having an appropriate dielectric constant. The dielectric body 15 may be a material that allows a hole to be formed by machining tools such as, for example, a drill and a laser used in manufacturing the printed circuit board.

Moreover, the printed circuit board 10 includes an inner electrode 16 (one example of a "second electrode" referred to herein). The inner electrode 16 is a tubular electric conductor formed along an inner circumferential surface of a hole extending through a central portion of the dielectric body 15, the resin layer 13 and the second board 12. That is to say, the inner electrode 16 is formed on an inner circumferential surface of a hole extending through the printed circuit board 10. Thus, the inner electrode 16 formed along the inner circumferential surface of the hole extending through the printed circuit board 10 has a form similar to a so-called TSV (Through Silicon Via).

The outer electrode 14, the inner electrode 16 and the dielectric body 15 described above constitute a capacitor 17. That is, when a potential difference is generated between the outer electrode 14 and the inner electrode 16, electric charges are accumulated in the capacitor 17.

Effects of the printed circuit board 10 according the first embodiment were verified. The verification results are shown below. For example, when a material having a dielectric constant of 4.3 is used as the dielectric body 15 and when the capacity of the capacitor 17 is set at 1 pF, the length and diameter of the outer electrode 14 and the diameter of the inner electrode 16 are as follows.

TABLE 1

| Outer via length (Upper (L1 side) layer thickness) | Inner via diameter | | | | | |
|---|---|---|---|---|---|---|
| | Φ 0.2 mm | Φ 0.3 mm | Φ 0.4 mm | Φ 0.5 mm | Φ 0.6 mm | Φ 0.7 mm |
| 0.5 mm | Φ 0.225 mm | Φ 0.338 mm | Φ 0.450 mm | Φ 0.563 mm | Φ 0.676 mm | Φ 0.788 mm |
| 0.7 mm | Φ 0.236 mm | Φ 0.354 mm | Φ 0.472 mm | Φ 0.591 mm | Φ 0.709 mm | Φ 0.827 mm |
| 0.9 mm | Φ 0.248 mm | Φ 0.372 mm | Φ 0.496 mm | Φ 0.620 mm | Φ 0.744 mm | Φ 0.868 mm |
| 1.1 mm | Φ 0.260 mm | Φ 0.390 mm | Φ 0.520 mm | Φ 0.650 mm | Φ 0.780 mm | Φ 0.910 mm |
| 1.3 mm | Φ 0.272 mm | Φ 0.409 mm | Φ 0.545 mm | Φ 0.682 mm | Φ 0.818 mm | Φ 0.955 mm |
| 1.5 mm | Φ 0.286 mm | Φ 0.429 mm | Φ 0.572 mm | Φ 0.715 mm | Φ 0.858 mm | Φ 1.002 mm |
| 1.7 mm | Φ 0.300 mm | Φ 0.450 mm | Φ 0.600 mm | Φ 0.750 mm | Φ 0.900 mm | Φ 1.051 mm |

Figure 3:
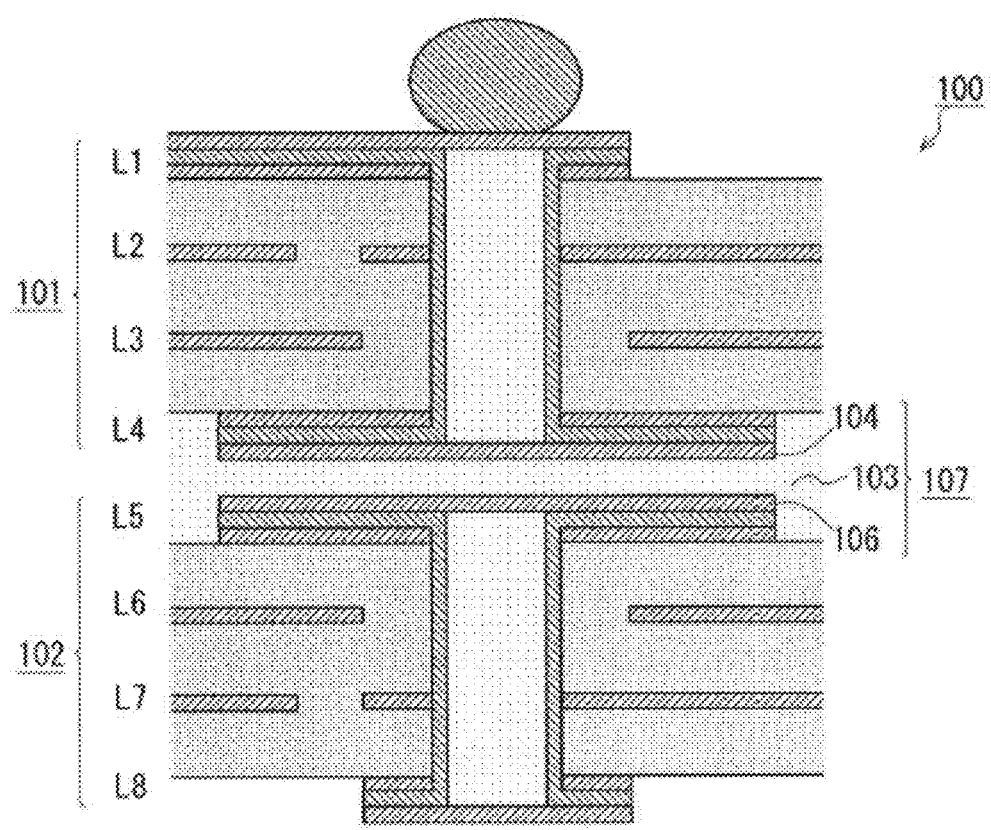
FIG. 3 is a view illustrating a portion of an internal structure of a printed circuit board according a comparative example, in which a capacitor portion is mainly illustrated.

FIG. 3 is a view illustrating a portion of an internal structure of a printed circuit board according a comparative example, in which a capacitor portion is mainly illustrated.

As illustrated in FIG. 3, a printed circuit board 100 according to a comparative example is a multilayer wiring board having eight (8) wiring layers L1 to L8 and is a board to be installed within various kinds of electronic devices. The printed circuit board 100 is a board formed by bonding a first board 101 and a second board 102 to each other by a resin, in which the first board 101 is a multilayer wiring board having four wiring layers L1 to L4 and the second board 102 is a multilayer wiring board having four wiring layers L5 to L8, which are bonded to each other by a resin. Thus, in the printed circuit board 100, a resin layer 103 is provided between the wiring layer L4 and the wiring layer L5.

In the printed circuit board 100 according to the comparative example, an upper electrode 104 formed on a lower surface of the first board 101 and a lower electrode 106 formed on an upper surface of the second board 102 are disposed to be opposite to each other with the resin layer 103 functioning as a dielectric body being interposed therebetween. The upper electrode 104, the lower electrode 106, and the resin layer 103 constitute a capacitor 107. That is, when a potential difference is generated between the upper electrode 104 and the lower electrode 106, electric charges are accumulated in the capacitor 107.

In the printed circuit board 100 according to the comparative example, in the case where the capacitor 107 having a capacity of 1 pF is realized using the resin layer 103 having a dielectric constant of 4.3, the diameter of each of the upper electrode 104 and the lower electrode 106 becomes 2.6 mm (when the gap between the upper electrode 104 and the lower electrode 106 is 0.2 mm). Accordingly, in the case of realizing the capacitor having a capacity of 1 pF, the ratio of an area occupied by the capacitor 17 of the first embodiment in the printed circuit board 10 to an area occupied by the capacitor 107 of the comparative example in the printed circuit board 100 is as follows.

TABLE 2

| Outer via length (Upper (L1 side) layer thickness) | Inner via diameter | | | | | |
|---|---|---|---|---|---|---|
| | Φ 0.2 mm | Φ 0.3 mm | Φ 0.4 mm | Φ 0.5 mm | Φ 0.6 mm | Φ 0.7 mm |
| 0.5 mm | Φ 0.225 mm | Φ 0.338 mm | Φ 0.450 mm | Φ 0.563 mm | Φ 0.676 mm | Φ 0.788 mm |
| 0.7 mm | Φ 0.236 mm | Φ 0.354 mm | Φ 0.472 mm | Φ 0.591 mm | Φ 0.709 mm | Φ 0.827 mm |
| 0.9 mm | Φ 0.248 mm | Φ 0.372 mm | Φ 0.496 mm | Φ 0.620 mm | Φ 0.744 mm | Φ 0.868 mm |
| 1.1 mm | Φ 0.260 mm | Φ 0.390 mm | Φ 0.520 mm | Φ 0.650 mm | Φ 0.780 mm | Φ 0.910 mm |
| 1.3 mm | Φ 0.272 mm | Φ 0.409 mm | Φ 0.545 mm | Φ 0.682 mm | Φ 0.818 mm | Φ 0.955 mm |
| 1.5 mm | Φ 0.286 mm | Φ 0.429 mm | Φ 0.572 mm | Φ 0.715 mm | Φ 0.858 mm | Φ 1.002 mm |
| 1.7 mm | Φ 0.300 mm | Φ 0.450 mm | Φ 0.600 mm | Φ 0.750 mm | Φ 0.900 mm | Φ 1.051 mm |

As indicated in the table above, it can be noted that the printed circuit board 10 of the first embodiment is capable of realizing the capacitor 17 having the same capacity as the capacitor 107 of the printed circuit board 100 of the comparative example with an area smaller than that of the capacitor 107 of the printed circuit board 100 of the comparative example.

Furthermore, the size of a circle having a diameter of 2.6 mm is larger than a standard ceramic capacitor having the 1005 size (1 mm×0.5 mm), which is mounted on a surface of a printed circuit board. Accordingly, in order to make the area of the upper electrode 104 or the lower electrode 106 smaller than the area of the ceramic capacitor having the 1005 size, it may be considered to shorten the gap between the upper electrode 104 and the lower electrode 106. However, for example, in order for the upper electrode 104 and the lower electrode 106 having a diameter of 1.12 mm to fall within a size range of the ceramic capacitor having a 1005 size, it is required that the gap between the upper electrode 104 and the lower electrode 106 be set at $37_{\mu m}$ or less (in the case where the dielectric constant is 4.3). However, when the gap between the upper electrode 104 and the lower electrode 106 becomes $37_{\mu m}$ or less, the resin serving as a dielectric body is too thin to maintain insulation between the upper electrode 104 and the lower electrode 106. Moreover, in order to change the material of the dielectric body to maintain the gap between the upper electrode 104 and the lower electrode 106 at 0.2 mm, it is required to form a dielectric body having a dielectric constant of 23. However, a resin having such a dielectric constant does not exist among the resins employed as the material of the printed circuit board. In addition, it is not a main purpose of the resin layer 103 to form the capacitor 107. That is, the structure in which the first board 101 and the second board 102 are bonded to each other is employed in the printed circuit board 100 in order to enhance the strength and the reliability. It is difficult to change the material of the resin layer 103 for the purpose of enhancing the dielectric constant.

Meanwhile, the printed circuit board 10 of the first embodiment may be manufactured using a manufacturing method used in the related art without having to use a special manufacturing process or a special material. Furthermore, the printed circuit board 10 of the first embodiment is capable of cutting off the noise in an AC signal flowing through wiring lines of the printed circuit board 10 by using the space-saving capacitor 17. In the printed circuit board 10 of the first embodiment, the outer electrode 14 or the inner electrode 16 of the capacitor 17 may be connected to an arbitrary wiring layer. Thus, the printed circuit board 10 of the first embodiment is suitable for cutting off the noise of high-speed transmission flowing through a wiring line of an intermediate wiring layer which is less susceptible to noise.

Furthermore, the printed circuit board 10 of the first embodiment is provided with the capacitor 17 in place of a ceramic capacitor such that the part cost of the ceramic capacitor can be reduced. Moreover, since the printed circuit board 10 is provided with the capacitor 17 in place of a ceramic capacitor, a process of mounting a ceramic capacitor on a board surface with a mounter is unnecessary, thereby reducing the time required for SMT (Surface Mount Technology) mounting. Furthermore, since the printed circuit board 10 does not require the process of mounting the ceramic capacitor on the board surface with the mounter, for example, there is no posed problem such as a so-called Manhattan phenomenon which cusses a ceramic capacitor to be mounted in a raised state, which may suppress a repair work for correcting the problem. Furthermore, the capacity of the capacitor 17 of the printed circuit board 10 may be appropriately changed by increasing or decreasing the diameter of the hole in which the outer electrode 14 or the inner electrode 16 is formed, or by replacing the material of the dielectric body 15 with a material having a different dielectric constant. Accordingly, even if ceramic capacitors having different capacities are not provided, the design change of a capacity is easily enabled at an appropriate timing such as, for example, after test production or before mass production, and, for example, the re-purchase of the provided parts is not required. Furthermore, since the capacitor 17 is not connected to a wiring line via a solder in the printed circuit board 10, the influence on an electronic device of the bonding lifespan of a solder or a conductive adhesive used in mounting a ceramic capacitor is negligible. In addition, since the capacitor 17 is formed within the printed circuit board 10, a product may be realized which is subject to the handling that may break the ceramic capacitor mounted on the surface of the board (e.g., the bending of the board or the drop-caused deflection of the board).

Figure 4:
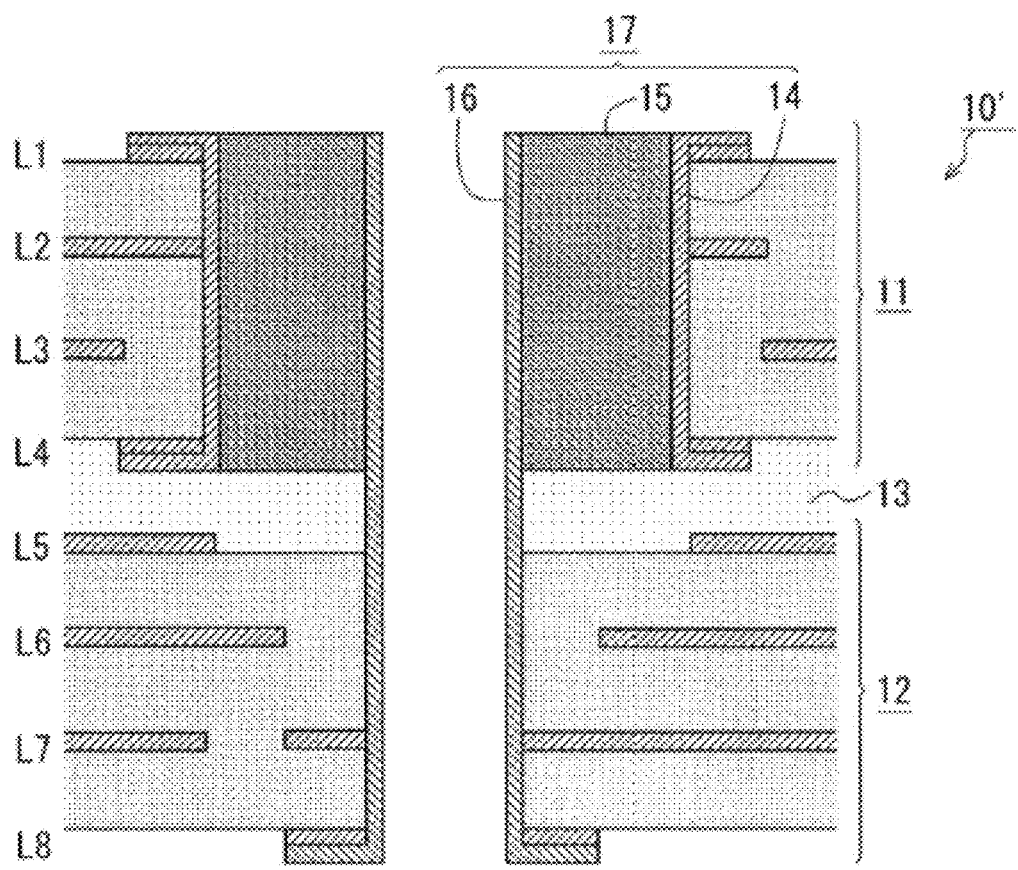
FIG. 4 is a view illustrating a first modification of the printed circuit board according the first embodiment, in which a capacitor portion is mainly illustrated.

As illustrated in FIG. 1, in the first embodiment, the outer electrode 14 is connected to a wiring line of the wiring layer L1 of the first board 11. However, the outer electrode 14 may be connected to a wiring line of any one of the four wiring layers L1 to L4 formed in the first board 11. For example, the outer electrode 14 may be connected to a wiring line of any one of the wiring layers L2, L3 and L4, rather than the wiring layer L1. FIG. 4 is a view illustrating a first modification of the printed circuit board 10 of the first embodiment, in which a capacitor portion is mainly illustrated. For example, in the printed circuit board 10 of the first embodiment 10, a wiring line of the wiring layer L2 rather than the wiring layer L1 may be connected to the outer electrode 14 as in a printed circuit board 10' of a first modification of the printed circuit board 10 of the first embodiment illustrated in FIG. 4.

Furthermore, as illustrated in FIG. 1, in the first embodiment, the inner electrode 16 is connected to a wiring line of the wiring layer L7 of the second board 12. However, the inner electrode 16 may be connected to a wiring line of any one of the four wiring layers L5 to L8 formed in the second board 12. For example, the inner electrode 16 may be connected to a wiring line of any one of the wiring layers L5, L6 and L8, rather than the wiring layer L7.

Furthermore, in the first embodiment, the printed circuit board 10 is formed by bonding the first board 11 and the second board 12 to each other with a resin. However, the printed circuit board 10 is not limited to that formed by bonding two boards with a resin. The printed circuit board 10 may be formed by bonding three or more boards.

Furthermore, in the first embodiment, the outer electrode 14 is formed in the first board 11. However, the outer electrode 14 may be formed in the second board 12, rather than the first board 11. The printed circuit board, in which the outer electrode 14 is formed in the second board 12, has an upside-down form of the printed circuit board 10 illustrated in FIG. 1.

Furthermore, in the first embodiment, the inside of the inner electrode 16 remains hollow. However, a conductive material such as, for example, copper may be filled inside the inner electrode 16, or a non-conductive material such as, for example, a resin may be filled inside the inner electrode 16.

Figure 5:
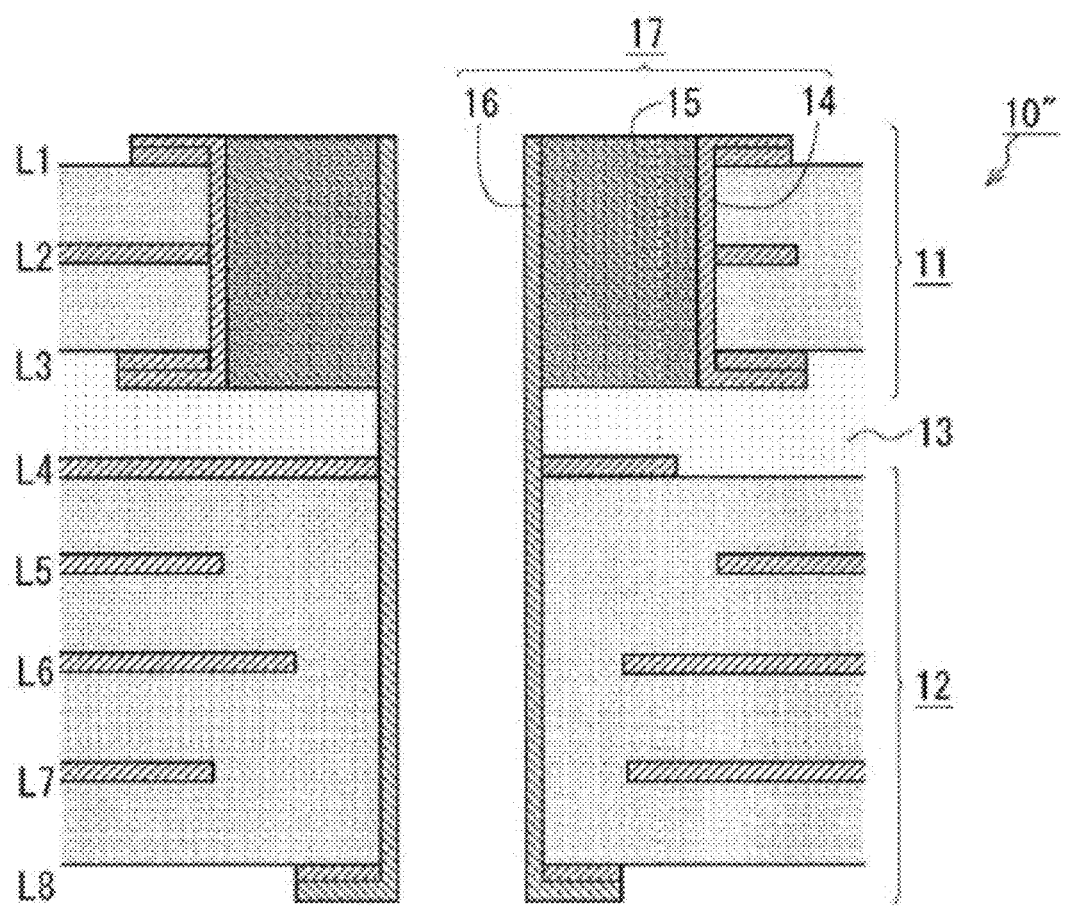
FIG. 5 is a view illustrating a second modification of the printed circuit board according the first embodiment, in which a capacitor portion is mainly illustrated.

Furthermore, in the first embodiment, the printed circuit board 10 is formed by bonding the first board 11, which has four wiring layers L1 to L4 and the second board 12, has four wiring layers L5 to L8, to each other. However, the printed circuit board 10 may be formed by bonding boards each having an appropriate number of wiring layers. Moreover, the printed circuit board 10 may be formed by bonding boards each having different numbers of wiring layers. FIG. 5 is a view illustrating a second modification of the printed circuit board 10 of the first embodiment, in which a capacitor portion is mainly illustrated. For example, in the printed circuit board 10 of the first embodiment, three wiring layers L1 to L3 may be formed in the first board 11 and five wiring layers L4 to L8 may be formed in the second board 12 as in a printed circuit board 10" of a second modification of the printed circuit board 10 of the first embodiment illustrated in FIG. 5. A wiring line of the wiring layer L4 is connected to the inner electrode 16 of the printed circuit board 10" of the second modification. When the printed circuit board 10 is formed by bonding boards each having an appropriate number of wiring layers, the degree of freedom of selection of a wiring layer, to which the inner electrode 16 is electrically connectable, may be widened.

Second Embodiment

Figure 6:
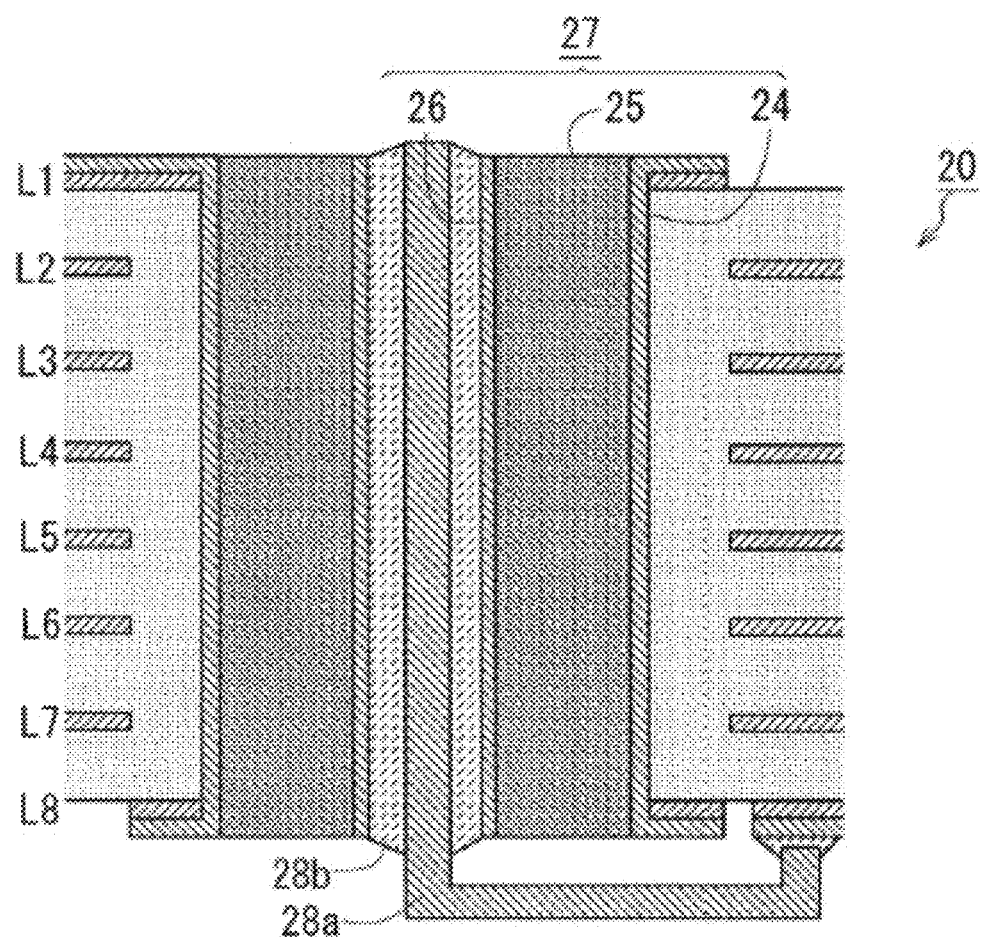
FIG. 6 is a view illustrating one example of an internal structure of a printed circuit board according a second embodiment, in which a capacitor portion is mainly illustrated.

FIG. 6 is a view illustrating one example of an internal structure of a printed circuit board according a second embodiment, in which a capacitor portion is mainly illustrated.

As illustrated in FIG. 6, a printed circuit board 20 according to a second embodiment is a multilayer wiring board having eight (8) wiring layers L1 to L8 and is a board to be installed within various kinds of electronic devices.

The printed circuit board 20 includes an outer electrode 24 (one example of a "first electrode" referred to herein). The outer electrode 24 is a tubular electric conductor formed along an inner circumferential surface of a hole extending through the printed circuit board 20. Furthermore, the printed circuit board 20 includes a dielectric body 25 disposed inside the outer electrode 24. The dielectric body 25 is formed so as to fill the inside of the outer electrode 24. Furthermore, the printed circuit board 20 includes an inner electrode 26 (one example of a "second electrode" referred to herein). The inner electrode 26 is a tubular electric conductor formed along an inner circumferential surface of a hole extending through a central portion of the dielectric body 25. The outer electrode 24 and the inner electrode 26 are formed on an inner circumferential surface of a hole extending through the printed circuit board 20. Thus, the outer electrode 24 and the inner electrode 26 formed along the inner circumferential surface of the hole extending through the printed circuit board 20 have a form similar to a so-called TSV.

The printed circuit board 20 includes a conductive pin 28a inserted into the inside of the tubular inner electrode 26. The end portion of the pin 28a is formed in a U-shape to be electrically connected to a wiring line of the wiring layer L8 of the printed circuit board 20. A solder 28b, which is a conductive material, is filled in a gap between the inner circumferential surface of the inner electrode 26 and the pin 28a.

The outer electrode 24, the inner electrode 26, and the dielectric body 25 described above constitute a capacitor 27. That is, when a potential difference is generated between the outer electrode 24 and the inner electrode 26, electric charges are accumulated in the capacitor 27.

In the printed circuit board 20 of the second embodiment, the outer electrode 24 is formed to extend from one surface of the printed circuit board 20 to the other surface thereof so that the capacitor 27 having a larger capacity than the capacitor 17 of the printed circuit board 10 of the first embodiment may be easily formed.

Furthermore, in the printed circuit board 20 of the second embodiment, the outer electrode 24 may be connected to a wiring line of an arbitrary wiring layer of the printed circuit board 20. That is, in the second embodiment, as illustrated in FIG. 6, the outer electrode 24 is connected to a wiring line of the wiring layer L1 of the printed circuit board 20. However, the outer electrode 24 may be connected to a wiring line of any one of the eight (8) wiring layers L1 to L8 formed in the printed circuit board 20. For example, the outer electrode 24 may be connected to a wiring line of any one of the wiring layers L2, L3, L4, L5, L6, L7 and L8, rather than the wiring layer L1.

Furthermore, in the second embodiment, the printed circuit board 20 is formed as a laminated body in which the eight (8) wiring layers L1 to L8 are laminated into one piece. However, the printed circuit board 20 may the one in which boards each having an appropriate number of wiring layers are bonded to each other with a resin.

Figure 7:
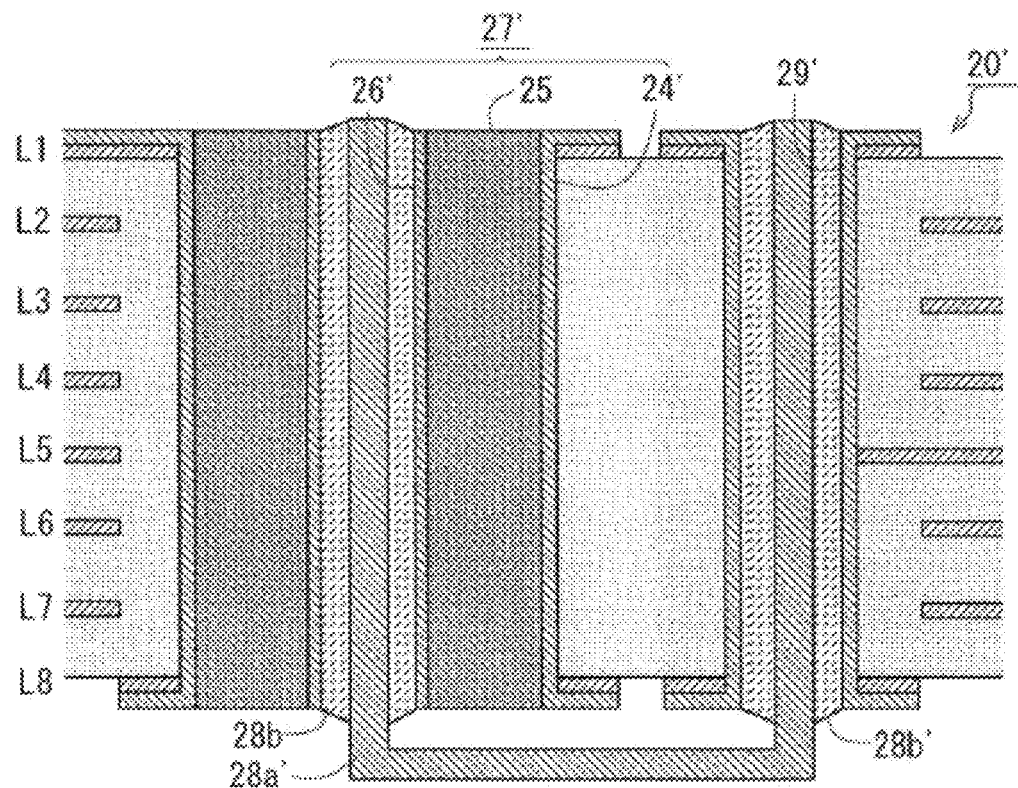
FIG. 7 is a view illustrating a modification of the printed circuit board according the second embodiment, in which a capacitor portion is mainly illustrated.

The conductive pin 28a inserted into the inner electrode 26 is connected to a wiring line of the wiring layer L8 of the printed circuit board 20. However, the conductive pin 28a may be connected to a wiring line of any one of the wiring layers L1 to L7 other than the wiring layer L8 of the printed circuit board 20. FIG. 7 is a view illustrating a modification of the printed circuit board 20 of the second embodiment, in which a capacitor portion is mainly illustrated.

As illustrated in FIG. 7, the printed circuit board 20' according to this modification includes a tubular electric conductor 29' (one example of a "conductor of another hole" referred to herein), which is formed along an inner circumferential surface of another hole provided in the printed circuit board 20' at a location that is different from the outer electrode 24'. The conductor 29' is electrically connected to a wiring line of the wiring layer L5 and the inner electrode 26' of the printed circuit board 20'. A U-shaped pin 28a' inserted into the inner electrode 26' at one end is inserted into the conductor 29' at the other end. A solder 28b', which is a conductive material, is filled in the gap between the inner circumferential surface of the conductor 29' and the pin 28a'.

In the printed circuit board 20' according to this embodiment, the outer electrode 24' may be connected to a wiring line of an arbitrary wiring layer. The inner electrode 26' may also be connected to a wiring line of an arbitrary wiring layer.

Third Embodiment

Figure 8:
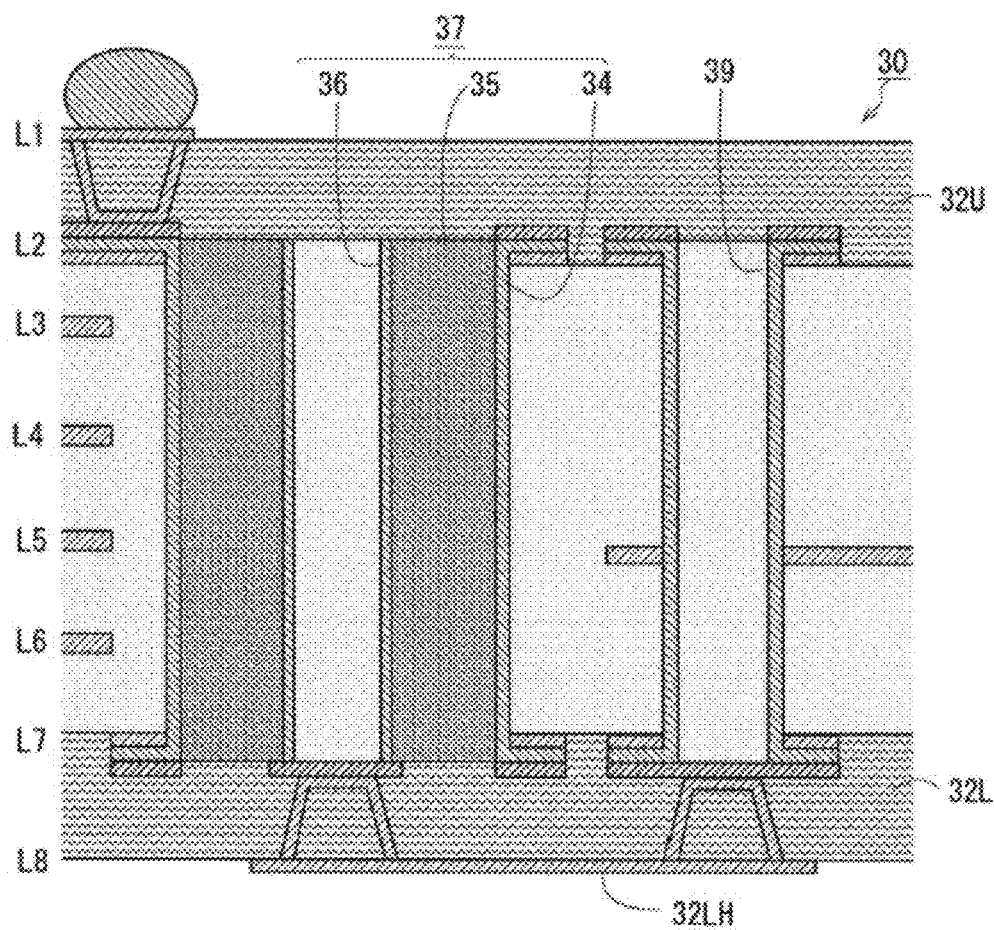
FIG. 8 is a view illustrating one example of an internal structure of a printed circuit board according a third embodiment, in which a capacitor portion is mainly illustrated.

FIG. 8 is a view illustrating one example of an internal structure of a printed circuit board according a third embodiment, in which a capacitor portion is mainly illustrated.

As illustrated in FIG. 8, a printed circuit board 30 according to a third embodiment is a multilayer wiring board having eight (8) wiring layers L1 to L8 and is a board to be installed within various kinds of electronic devices. The printed circuit board 30 is a board that includes a board 31 as a multilayer wiring board that forms six (6) wiring layers L2 to L7, an upper buildup layer 32U laminated on an upper surface of the board 31 to form a wiring layer L1, and a lower buildup layer 32L laminated on a lower surface of the board 31 to form a wiring layer L8.

The printed circuit board 30 includes an outer electrode 34 (one example of a "first electrode" referred to herein). The outer electrode 34 is a tubular electric conductor formed along an inner circumferential surface of a hole extending through the printed circuit board 30. Furthermore, the printed circuit board 30 includes a dielectric body 35 disposed inside the outer electrode 34. The dielectric body 35 is formed so as to fill the inside of the outer electrode 34. Furthermore, the printed circuit board 30 includes an inner electrode 36 (one example of a "second electrode" referred to herein). The inner electrode 36 is a tubular electric conductor formed along an inner circumferential surface of a hole extending through a central portion of the dielectric body 35. The outer electrode 34 and the inner electrode 36 are formed on an inner circumferential surface of a hole extending through the printed circuit board 30. The outer electrode 34, the dielectric body 35, and the inner electrode 36 form a capacitor 37.

Furthermore, the printed circuit board 30 includes a tubular electric conductor 39 (one example of a "conductor of another hole" referred to herein), which is formed along an inner circumferential surface of another hole provided in the printed circuit board 30 at a location differing from the outer electrode 34. The conductor 39 is electrically connected to a wiring line of the wiring layer L5 and the inner electrode 36 of the printed circuit board 30. The conductor 39 and the inner electrode 36 are electrically connected to each other via a wiring line 32LH of the wiring layer L8 formed in the lower buildup layer 32L.

In the printed circuit board 30 according to the third embodiment, not only the outer electrode 34 constituting the capacitor 37 but also the inner electrode 36 constituting the capacitor 37 may be electrically connected to an arbitrary wiring layer of the printed circuit board 30.

The printed circuit boards 10, 20, and 30 of the respective embodiments described above may be manufactured by any method. For example, the printed circuit board 10 of the first embodiment may be manufactured by the following method.

Figure 9A:
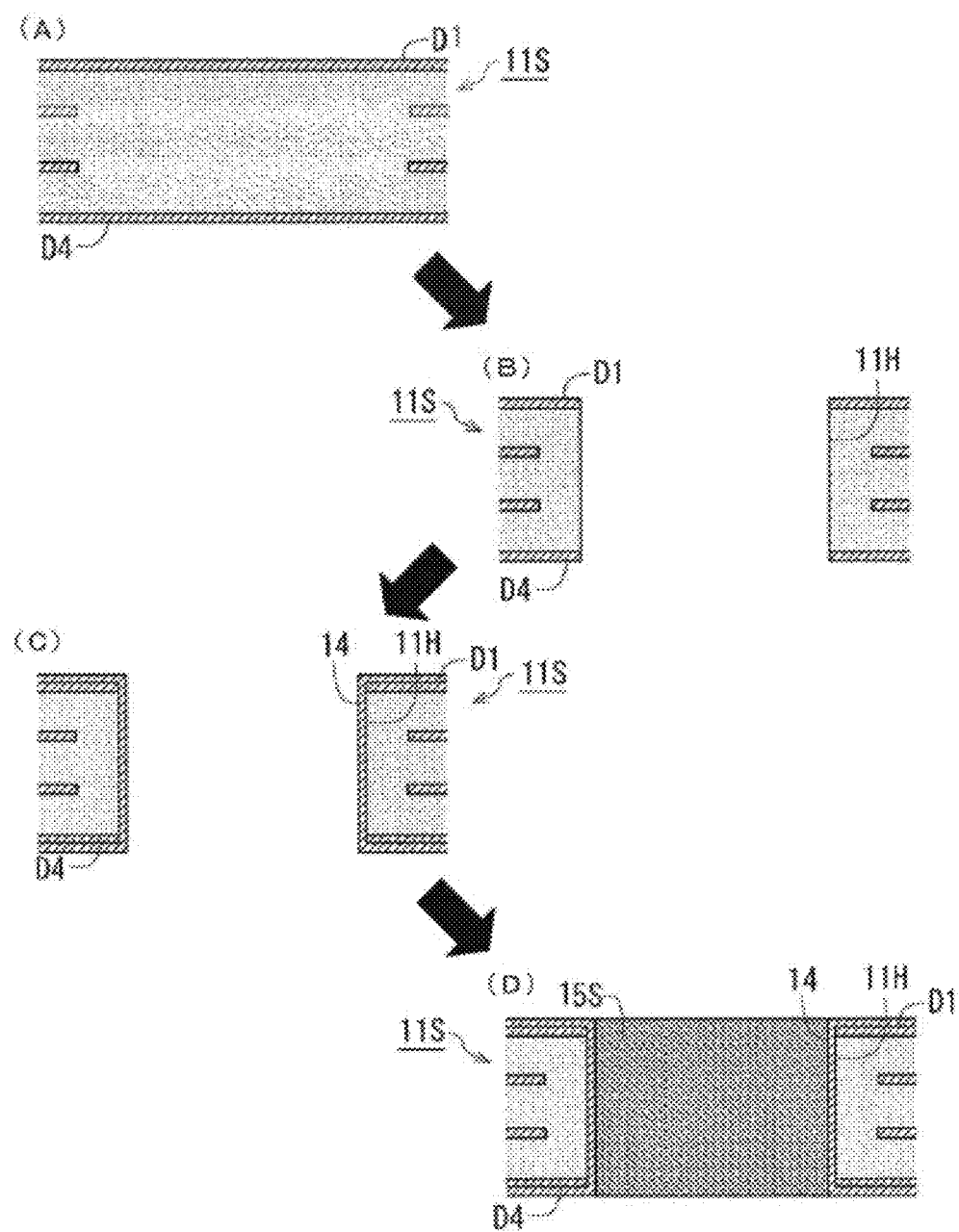
FIG. 9A is a first view illustrating a manufacturing method of the printed circuit board according to the first embodiment.

FIG. 9A is a first view illustrating a manufacturing method of the printed circuit board 10 of the first embodiment. When manufacturing the printed circuit board 10, a plate-shaped first member 11S which becomes the first board 11 is prepared (see, e.g., FIG. 9A(A)). Copper foils D1 and D4 corresponding to the wiring layers L1 and L4 are formed on the surfaces of the first member 11S. Furthermore, wiring lines corresponding to the wiring layers L2 and L3 have already been formed in the first member 11S. After the first member 11S is prepared, a first hole 11H extending through the first member 11S along a thickness direction is formed (see, e.g., FIG. 9A(B)). After the first hole 11H is formed, the first member 11S is subjected to a plating. As the first member 11S is subjected to a plating, the outer electrode 14, which is a tubular electric conductor, is formed along an inner circumferential surface of the first hole 11H (see, e.g., FIG. 9A(C)). After the outer electrode 14 is formed in the first hole 11H, a resin 15S which becomes the dielectric body 15 is filled inside the outer electrode 14 (see, e.g., FIG. 9A(D)).

Figure 9B:
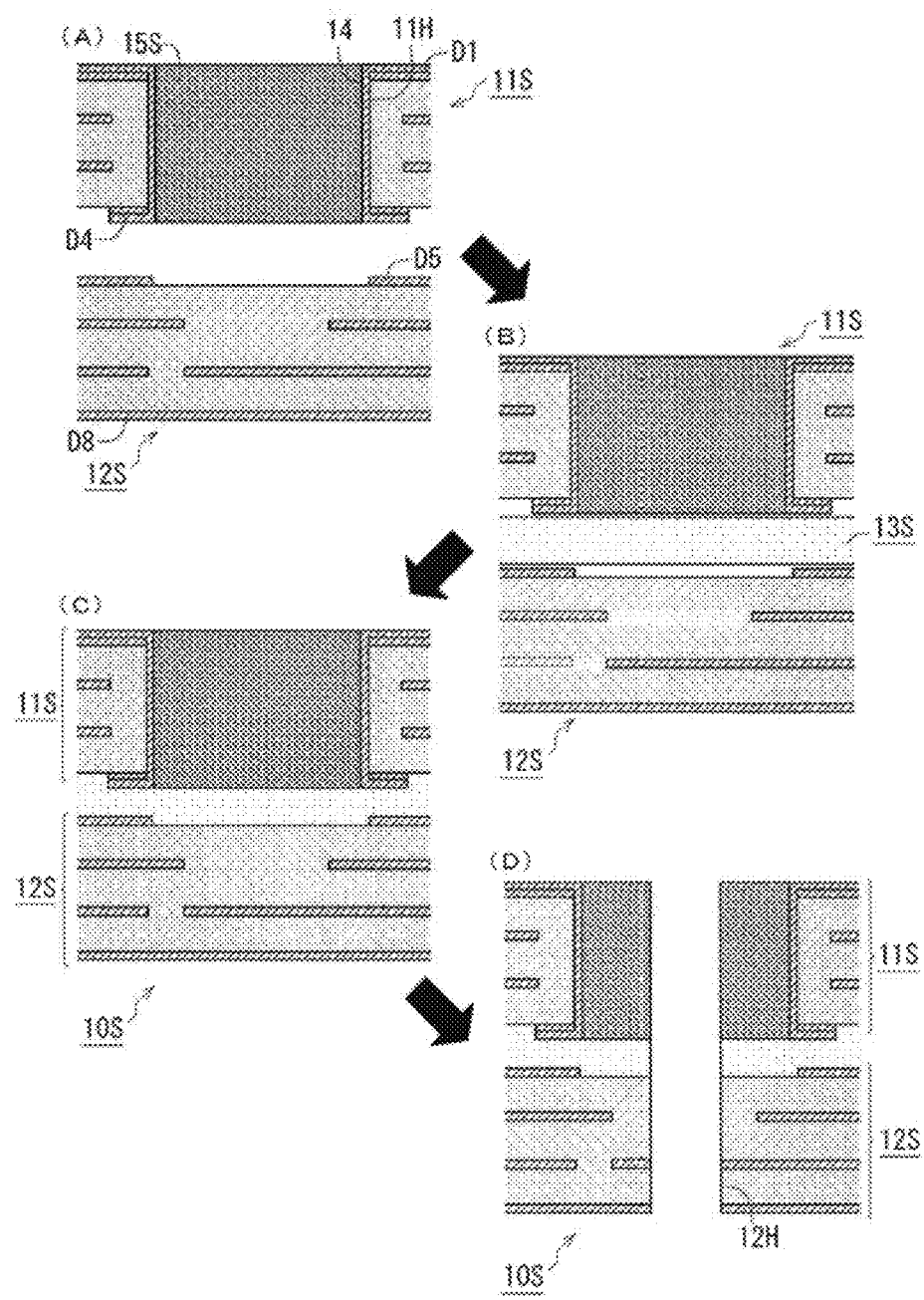
FIG. 9B is a second view illustrating the manufacturing method of the printed circuit board according to the first embodiment.

FIG. 9B is a second view illustrating the manufacturing method of the printed circuit board 10 of the first embodiment. After the resin 15S is filled inside the outer electrode 14, a plate-shaped second member 12S, which is another member to be bonded to the first member 11S and which becomes the second board 12, is prepared. It is assumed that copper foils D5 and D8 corresponding to the wiring layers L5 and L8 are formed on the surfaces of the second member 12S, and wiring lines corresponding to the wiring layers L6 and L7 have already been formed in the second member 12S. The copper foils D4 and D5 on the respective bonding surfaces of the first member 11S and the second member 12S are then subjected to a patterning (see, e.g., FIG. 9B(A)). After the copper foils D4 and D5 are subjected to a patterning, the first member 11S and the second member 12S are stacked by interposing therebetween a resin-made plate 13S which becomes the resin layer 13 (see, e.g., FIG. 9B(B)). After the first member 11S and the second member 12S are stacked with the plate 13S being interposed therebetween, the first member 11S, the second member 12S, and the plate 13S are pressed in a heated state. Thus, the first member 11S and the second member 12S become a mutually compressed state with the plate 13S interposed therebetween. Consequently, a laminated body 10S which becomes the printed circuit board 10 is formed (see, e.g., FIG. 9B(C)). After the first member 11S and the second member 12S are pressed into the laminated body 10S, a second hole 12H extending through a central portion of the resin 15S filled inside the outer electrode 14, the plate 13S, and the second member 12S, is formed (see, e.g., FIG. 9B(D)).

In the meantime, the position or the size of the second hole 12H controls the capacity of the capacitor 17. Thus, the center of the second hole 12H is required to coincide with the center of the first hole 11H. Accordingly, when forming the second hole 12H, a processing error may be suppressed, for example, by grasping a contour of the inner circumferential surface of the outer electrode 14 as a circle through the use of processing equipment having an image processing function and positioning a drill or a laser beam to be aimed at the center of the circle, or by providing a positioning mark (a reference hole or a position recognition mark) on the printed circuit board 10 in the vicinity of the capacitor 17, rather than a position distant from the capacitor 17 (e.g., a corner of the board).

Figure 9C:
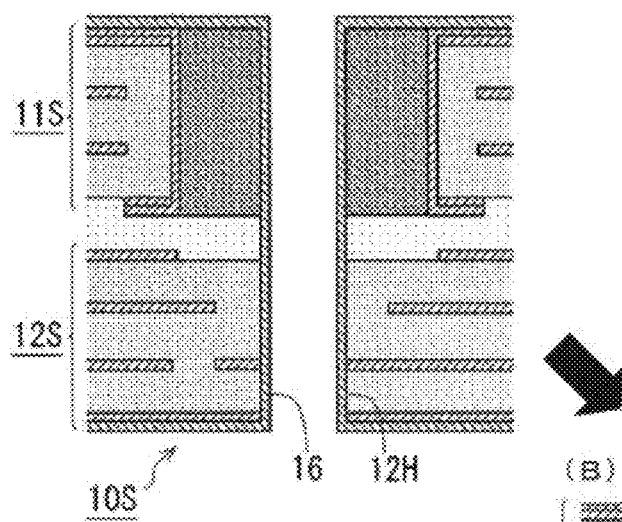
FIG. 9C is a third view illustrating the manufacturing method of the printed circuit board according to the first embodiment.
Figure 9C:
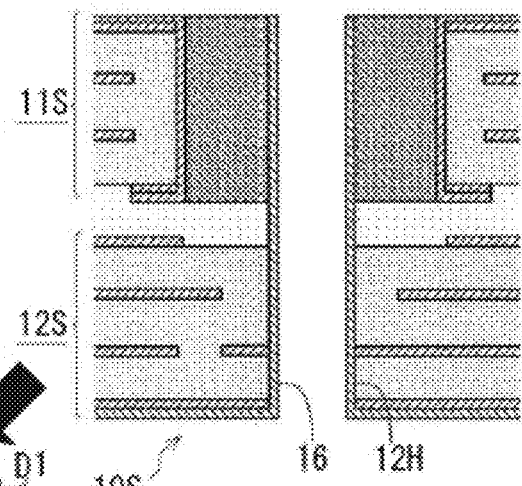
Figure 9C:
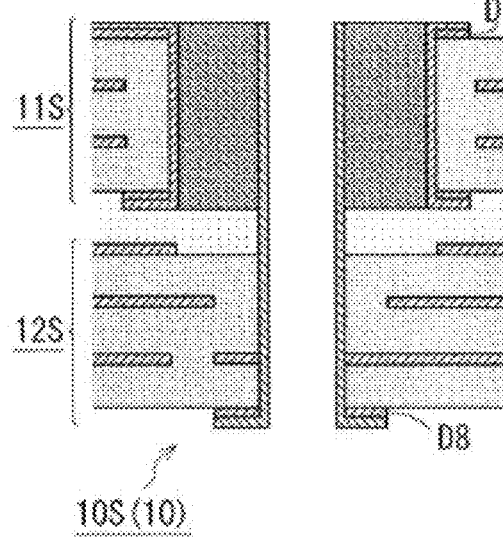

FIG. 9C is a third view illustrating the manufacturing method of the printed circuit board 10 of the first embodiment. After the second hole 12H is formed, the laminated body 10S is subjected to a plating. When the laminated body 10S is subjected to a plating, the inner electrode 16 serving as a tubular electric conductor is formed along an inner circumferential surface of the second hole 12H (see, e.g., FIG. 9C(A)). When the laminated body 10S is subjected to plating, the inner electrode 16 and the copper foil D1 become an electrically connected state. After he laminated body 10S is subjected to a plating, the surface of the laminated body 10S (the surface existing at the side of the wiring layer L1) is polished (see, e.g., FIG. 9C(B)). After the surface of the laminated body 10S is polished, the copper foil D1 of the first member 11S and the copper foil D8 of the second member 12S are subjected to a patterning, thereby leading to the completion of the printed circuit board 10 (see, e.g., FIG. 9C(C)). In view of the variation in a polishing amount when the surface of the laminated body 10S is polished, the copper foil D1 of the first member 11S is less susceptible to the variation in the polishing amount in the case where the copper foil D1 is relatively thick than a case where the copper foil D1 is relatively thin.

The capacitors 17, 27 and 37 may be designed according to the following capacity calculation formula:

$$C = \frac{2\pi\varepsilon_0 l}{\log\frac{b}{a}} \quad \text{[Equation 1]}$$

In Equation 1, a denotes the radius of the inner electrode 16, 26 or 36, b denotes the radius of the outer electrode 14, 24 or 34, l denotes the length of the outer electrode 14, 24 or 34, and $\varepsilon_0$ denotes the dielectric constant of the dielectric body 15, 25 or 35.

Accordingly, for example, in the case where the printed circuit board 10, 20 or 30 of each of the embodiments described above is applied to a printed circuit board installed within a large scale device such as a server or a communication device, for example, a capacitor having the following capacity may be manufactured as the capacitor 17, 27 or 37 formed in the printed circuit board.

Furthermore, for example, in the case where the printed circuit board 10, 20 or 30 of each of the embodiments described above is applied to a printed circuit board installed within a small scale electronic device, for example, a capacitor having the following capacity may be manufactured as the capacitor 17, 27 or 37 formed in the printed circuit board.

TABLE 4

|  | Dimension | Capacity |
|---|---|---|
| Hole length | 0.4 mm | 0.138 pF |
| Outer hole diameter | Φ 0.20 mm |  |
| Inner hole diameter | Φ 0.10 mm |  |
| Dielectric constant | 4.3 |  |

When it is desired to increase the capacity of the capacitor 17, 27 or 37, it is considered, for example, that the dielectric constant of the dielectric body 15, 25 or 35 is increased. As for a material applied to the dielectric body 15, 25 and 35, the following materials may be exemplified.

TABLE 5

|  | Name of material | Dielectric constant |
|---|---|---|
| Resin | FR4 (epoxy resin) | 4 to 5 |
|  | Phenolic resin | 10 |
| Dielectric ceramic | Aluminum oxide | 8 to 10 |
|  | Tantalum oxide | 25 |
|  | Barium titanate | 1500 to 15000 |

In recent years, in addition to the aforementioned resins, resins having a dielectric constant of about 7 to 8 have also been developed. In the case where dielectric ceramic having a high dielectric constant is used to increase the capacity, the compatibility of the printed circuit board 10, 20 or 30 with a resin and the reliability as the capacitor 17, 27 or 37 may be verified. Furthermore, the aforementioned barium titanate is a material that is worth considering the application thereof as the dielectric body 15, 25 or 35 in such a case where a capacity of about several pF is required to cut off the noise (e.g., in the case where the capacitor is to be used as a substitute for a bypass capacitor (also referred to as a "pass capacitor")). Moreover, it is also considered that a resin containing barium titanate as filler is applied as the dielectric body 15, 25 or 35, thereby increasing the dielectric constant so that the capacitor thus obtained may be used as a noise-cutting capacitor 17, 27 or 37.

In the case where the phenolic resin introduced in Table 5 is used as the dielectric body 15, 25 or 35, for example, a

TABLE 3

| Outer via length (Upper (L1 side) layer thickness) | Inner via diameter | | | | | |
|---|---|---|---|---|---|---|
|  | Φ 0.2 mm | Φ 0.3 mm | Φ 0.4 mm | Φ 0.5 mm | Φ 0.6 mm | Φ 0.7 mm |
| 0.5 mm | Φ 0.225 mm | Φ 0.338 mm | Φ 0.450 mm | Φ 0.563 mm | Φ 0.676 mm | Φ 0.788 mm |
| 0.7 mm | Φ 0.236 mm | Φ 0.354 mm | Φ 0.472 mm | Φ 0.591 mm | Φ 0.709 mm | Φ 0.827 mm |
| 0.9 mm | Φ 0.248 mm | Φ 0.372 mm | Φ 0.496 mm | Φ 0.620 mm | Φ 0.744 mm | Φ 0.868 mm |
| 1.1 mm | Φ 0.260 mm | Φ 0.390 mm | Φ 0.520 mm | Φ 0.650 mm | Φ 0.780 mm | Φ 0.910 mm |
| 1.3 mm | Φ 0.272 mm | Φ 0.409 mm | Φ 0.545 mm | Φ 0.682 mm | Φ 0.818 mm | Φ 0.955 mm |
| 1.5 mm | Φ 0.286 mm | Φ 0.429 mm | Φ 0.572 mm | Φ 0.715 mm | Φ 0.858 mm | Φ 1.002 mm |
| 1.7 mm | Φ 0.300 mm | Φ 0.450 mm | Φ 0.600 mm | Φ 0.750 mm | Φ 0.900 mm | Φ 1.051 mm | capacitor having the following capacity may be manufactured as the capacitor 17, 27 or 37.

TABLE 6

|  | Dimension | Capacity |
| --- | --- | --- |
| Hole length | 1.0 mm | 0.656 pF |
| Outer hole diameter | Φ 0.35 mm |  |
| Inner hole diameter | Φ 0.15 mm |  |
| Dielectric constant | 10 |  |

That is, as is apparent from the comparison of Table 4 and Table 6, it can be understood that in the case of using the phenolic resin as the dielectric body 15, 25 or 35, the capacitor 17, 27 or 37 having a twofold or more capacity may be realized while keeping the size of the respective portions unchanged.

Furthermore, when it is desired to increase the capacity of the capacitor 17, it is considered, for example, that the thickness of the first board 11 is increased. In the case where a high-density packaging product is considered, the length of a hole formed by a drill may be about 1.0 mm. In the case where a high-density packaging is not required, however, a hole having a length of about 1.6 mm may be formed. Accordingly, in the case where the thickness of the first board 11 is changed from 1.0 mm to 1.6 mm, for example, a capacitor having the following capacity may be manufactured as the capacitor 17.

TABLE 7

|  | Dimension | Capacity |
| --- | --- | --- |
| Hole length | 1.0 mm | 0.656 pF |
| Outer hole diameter | Φ 0.35 mm |  |
| Inner hole diameter | Φ 0.15 mm |  |
| Dielectric constant | 10 |  |

Furthermore, when it is desired to increase the capacity of the capacitor 17, 27 or 37, it is considered, for example, that the thickness of the dielectric body 15, 25 or 35 is increased. The realizable thickness reduction in the dielectric body 15, 25 or 35 depends on the accuracy in drilling position of a hole formed when making the outer electrode 14, 24 or 34 and a hole formed when making the inner electrode 16, 26 or 36. A drilling machine used for manufacturing a typical printed circuit board may have a drilling deflection of ±0.1 mm. However, when a tuning is performed according to, for example, the adjustment of a drilling speed or the change of a position recognition method, the drilling deflection may be settled to fall within a range of about ±0.05 mm. Furthermore, when a highly-accurate drilling machine is developed, the drilling deflection may be settled to fall within a range of about ±0.025 mm. For example, in the case where the thickness of the dielectric body 15, 25 or 35 is changed from 0.1 mm to 0.05 mm (in the case where the inner hole diameter is changed from Φ 0.15 mm to Φ 0.25 mm), for example, a capacitor having the following capacity may be manufactured as the capacitor 17, 27 or 37.

TABLE 8

|  | Dimension | Capacity |
| --- | --- | --- |
| Hole length | 1.0 mm | 0.711 pF |
| Outer hole diameter | Φ 0.35 mm |  |
| Inner hole diameter | Φ 0.25 mm |  |
| Dielectric constant | 4.3 |  |

When a phenolic resin is used as the dielectric body 15, the thickness of the first board 11 is set to 1.6 mm, and the thickness of the dielectric body 15 is set to 0.05 mm, for example, a capacitor having the following capacity may be manufactured as the capacitor 17.

TABLE 9

|  | Dimension | Capacity |
| --- | --- | --- |
| Hole length | 1.0 mm | 0.711 pF |
| Outer hole diameter | Φ 0.35 mm |  |
| Inner hole diameter | Φ 0.25 mm |  |
| Dielectric constant | 4.3 |  |

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed circuit board comprising:
   a first multilayer board that includes a first outer wiring and a first inner wiring, the first outer wiring being formed on a surface of the first multilayer board and the first inner wiring being formed between layers of the first multilayer board;
   a second multilayer board bonded to the first multilayer board and that includes a second outer wiring and a second inner wiring, the second outer wiring being formed on a surface of the second multilayer board and the second inner wiring being formed between layers of the second multilayer board;
   a first hole formed in the first multilayer board;
   a first electrode made of a tubular electric conductor formed on an inner wall of the first hole;
   a second hole formed in the first hole and that penetrates through the first multilayer board and the second multilayer board;
   a second electrode made of a tubular electric conductor formed on an inner wall of the second hole, the second electrode having a center axis concentric with the first electrode; and
   a dielectric body formed between the first electrode and the second electrode, wherein
   one of the first outer wiring and the first inner wiring is coupled to the first electrode, and
   one of the second outer wiring and the second inner wiring is coupled to the second electrode.

2. The printed circuit board according to claim 1, further comprising:
   an electric conductor formed in a third hole provided in the printed circuit board at a location different from a location of the first electrode, and electrically connected to a wiring line of any one of wiring layers of the printed circuit board and the second electrode.

3. The printed circuit board according to claim 1, further comprising:
   a pin inserted into the second electrode and having an end portion electrically connected to a wiring line of the printed circuit board; and a conductive material filled in a gap between an inner circumferential surface of the second electrode and the pin.

4. The printed circuit board according to claim 2, further comprising:
a wiring layer further laminated on the printed circuit board and having a wiring line electrically connected to an end portion of the second electrode and an end portion of the conductor formed in the third hole.

5. An electronic device including a printed circuit board, wherein the printed circuit board comprises:
a first multilayer board that includes a first outer wiring and a first inner wiring, the first outer wiring being formed on a surface of the first multilayer board and the first inner wiring being formed between layers of the first multilayer board;
a second multilayer board bonded to the first multilayer board and that includes a second outer wiring and a second inner wiring, the second outer wiring being formed on a surface of the second multilayer board and the second inner wiring being formed between layers of the second multilayer board;
a first hole formed in the first multilayer board;
a first electrode made of a tubular electric conductor formed on an inner wall of the first hole;
a second hole formed in the first hole and that penetrates through the first multilayer board and the second multilayer board;
a second electrode made of a tubular electric conductor formed on an inner wall of the second hole, and having a center axis concentric with the first electrode; and
a dielectric body formed between the first electrode and the second electrode, wherein
one of the first outer wiring and the first inner wiring is coupled to the first electrode, and
one of the second outer wiring and the second inner wiring is coupled to the second electrode.

6. A manufacturing method of a printed circuit board, the manufacturing method comprising:
forming a tubular electric conductor serving as a first electrode along an inner circumferential surface of a first hole formed in a first multilayer board;
disposing a dielectric body inside the first electrode;
bonding a second multilayer board to the first multilayer board;
forming a second hole to penetrate the dielectric body and the second multilayer board; and
forming a tubular electric conductor serving as a second electrode along an inner circumferential surface of the second hole, the second electrode having a center axis concentric with the first electrode, wherein
the first multilayer board includes a first outer wiring that is formed on a surface of the first multilayer board and a first inner wiring that is formed between layers of the first multilayer board,
the second multilayer board includes a second outer wiring that is formed on a surface of the second multilayer board and a second inner wiring that is formed between layers of the second multilayer board,
one of the first outer wiring and the first inner wiring is coupled to the first electrode, and
one of the second outer wiring and the second inner wiring is coupled to the second electrode.

7. The manufacturing method according to claim 6, wherein the printed circuit board is a multilayer wiring board, and
the manufacturing method further comprising:
forming a conductor in a third hole provided in the printed circuit board at a location that is different from a location of the first electrode such that the conductor of the third hole is electrically connected to a wiring line of any one of wiring layers of the printed circuit board and the second electrode.

8. The manufacturing method according to claim 7, further comprising:
forming a wiring layer to be further laminated on the printed circuit board, the wiring layer having a wiring line electrically connected to an end portion of the second electrode and an end portion of the conductor of the third hole.

9. The manufacturing method according to claim 6, further comprising:
inserting a conductive pin into the second electrode such that one end of the conductive pin is electrically connected to a wiring line of the printed circuit board; and
filling a conductive material in a gap between an inner circumferential surface of the second electrode and the pin.

* * * * *